United States Patent
Lin et al.

(10) Patent No.: US 7,257,787 B2
(45) Date of Patent: Aug. 14, 2007

(54) METHOD FOR REDUCING AN EQUIVALENT RESISTANCE IN AN IC LAYOUT

(75) Inventors: Jai-Ming Lin, Taichung (TW); Chao-Cheng Lee, Hsin Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 410 days.

(21) Appl. No.: 10/924,505

(22) Filed: Aug. 24, 2004

(65) Prior Publication Data

US 2005/0055654 A1    Mar. 10, 2005

(30) Foreign Application Priority Data

Sep. 8, 2003    (TW) ............... 92124691 A (51) Int. Cl.
*G06F 9/45* (2006.01)
(52) U.S. Cl. .............. 716/5; 716/4; 716/8; 716/11; 716/13
(58) Field of Classification Search .......... 716/1, 716/4, 5, 7, 8, 12, 13, 21; 257/327
See application file for complete search history.

(56) References Cited

U.S. PATENT DOCUMENTS

| | | | |
|---|---|---|---|
| 6,487,706 B1 * | 11/2002 | Barkley et al. .......... 716/7 |
| 6,732,335 B2 | 5/2004 | Takabayashi et al. | |
| 6,735,749 B2 * | 5/2004 | Li et al. ................ 716/5 |
| 6,757,875 B2 * | 6/2004 | Matsuoka ............. 716/4 |
| 6,760,897 B2 * | 7/2004 | Arakawa et al. ....... 716/13 |
| 6,779,167 B2 * | 8/2004 | Igarashi et al. ........ 716/13 |
| 6,785,877 B1 * | 8/2004 | Kozai .................. 716/12 |
| 6,789,246 B1 * | 9/2004 | Mohan et al. .......... 716/11 |
| 6,795,957 B2 * | 9/2004 | Lai et al. ............... 716/12 |
| 6,829,754 B1 * | 12/2004 | Yu et al. ............... 716/5 |
| 6,966,047 B1 * | 11/2005 | Glasser ................. 716/19 |
| 7,013,444 B2 * | 3/2006 | Igarashi et al. ........ 716/8 |
| 7,047,514 B2 * | 5/2006 | Mizuno et al. ......... 716/14 |
| 7,124,389 B2 * | 10/2006 | Igarashi et al. ........ 716/13 |
| 7,124,390 B2 | 10/2006 | Smith | |

(Continued)

OTHER PUBLICATIONS

Haruyama et al.,, "Topological routing using geometric information", Nov. 11-15, 1990, Computer-Aided Design, ICCAD-90. Digest of Technical Papers., IEEE International Conference on, pp. 6-9.*

(Continued)

*Primary Examiner*—Paul Dinh
*Assistant Examiner*—Helen Rossoshek
(74) *Attorney, Agent, or Firm*—Winston Hsu (57) ABSTRACT

A method of the invention is used for checking the via density between two adjacent layers of an IC layout. The method includes selecting a first metal layer and a second metal layer, wherein the first metal layer is adjacent to the second one, each of the metal layers has at least a wire, and the metal layers are coupled to each other through at least a first via; calculating the cross-sectional area of the first via and the overlapping area of the overlapped part of the wires in the first and the second metal layers; and disposing at least a second via in the overlapped part to couple the first and the second metal layers if the ratio of the cross-sectional area to the overlapping area is smaller than a predetermined ratio value.

5 Claims, 6 Drawing Sheets

U.S. PATENT DOCUMENTS

| | | |
|---|---|---|
| 7,134,108 B2 | 11/2006 | Lin et al. |
| 2002/0083407 A1* | 6/2002 | Suzuki et al. ................. 716/13 |
| 2003/0057476 A1* | 3/2003 | Morita et al. ............... 257/327 |
| 2003/0079194 A1* | 4/2003 | Igarashi et al. ................ 716/8 |
| 2004/0121244 A1* | 6/2004 | Misaka .......................... 430/5 |
| 2004/0139407 A1* | 7/2004 | Mukai et al. ................... 716/4 |
| 2004/0194042 A1* | 9/2004 | Matsuoka ...................... 716/4 |
| 2005/0132306 A1* | 6/2005 | Smith et al. .................... 716/1 |
| 2005/0166176 A1* | 7/2005 | Watanabe et al. ............. 716/21 |

OTHER PUBLICATIONS

Haruyama et al., "Topological channel routing [VLSI]", Oct. 1992, Computer-Aided Design of Integrated Circuits and Systems, IEEE Transactions on, vol. 11, Issue 10, pp. 1177-1197.*

* cited by examiner

METHOD FOR REDUCING AN EQUIVALENT RESISTANCE IN AN IC LAYOUT

This application claims the benefit of Taiwan application Serial No. 092124691, filed Sep. 8, 2003, the subject matter of which is incorporated herein by reference.

BACKGROUND OF THE INVENTION

1. Field of the Invention

The invention relates in general to a method for checking an IC layout, and more particularly to a method for checking out the wire layout causing the high wire resistance in an IC layout.

2. Description of the Related Art

Figure 1:
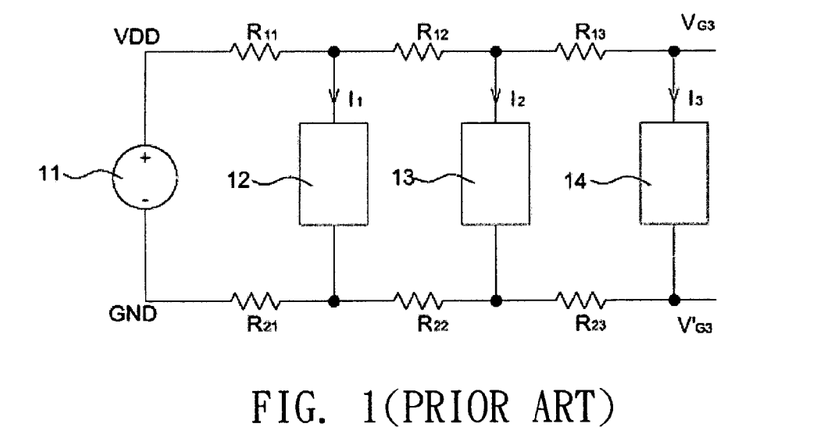
FIG. 1 is a partially equivalent circuit diagram showing a conventional integrated circuit (IC).

FIG. 1 shows a partial equivalent circuit diagram of a conventional integrated circuit (IC). As shown in this drawing, the equivalent circuit 10 includes a voltage source 11, several equivalent wire resistors $R_{11}$, $R_{12}$, $R_{13}$, $R_{21}$, $R_{22}$ and $R_{23}$, and several device units 12, 13 and 14. Theoretically, the equivalent resistance of an ideal wire is zero in the circuit property. In fact, however, each wire has an equivalent resistance. If the electric currents flowing through the device units 12, 13 and 14 are $I_1$, $I_2$ and $I_3$, respectively, because the equivalent wire resistors $R_{11}$, $R_{12}$ and $R_{13}$ cause voltage drops and the equivalent wire resistors $R_{21}$, $R_{22}$ and $R_{23}$ cause ground bounces, the voltages $V_{G3}$ and $V'_{G3}$ are represented in the following equations according to the ohm's law:

$$V_{G3} = V - R_{11}(I_1+I_2+I_3) - R_{12}(I_2+I_3) - R_{13}*I_3 \quad (1), \text{ and}$$

$$V'_{G3} = R_{21}(I_1+I_2+I_3) + R_{22}(I_2+I_3) + R_{23}*I_3 \quad (2).$$

Thus, the operation voltage (the voltage drop across two ends) of the device unit 14 is not the ideal voltage (VDD−GND), but is ($V_{G3}$−$V'_{G3}$), which is less than (VDD−GND) for $(R_{21}+R_{11})(I_1+I_2+I_3)+(R_{22}+R_{12})(I_2+I_3)+(R_{23}+R_{13})*I_3$. Hence, the larger the equivalent wire resistance is, the larger the voltage drop is. The large equivalent wire resistance may cause the timing problems and the functional failures of the device unit. The above-mentioned problem becomes worse when the IC manufacturing technology is getting more and more advanced such that the wire line width is getting smaller and smaller, and the wire's equivalent resistance is getting larger and larger. Thus, the difference between the actual operation voltage of the device and the ideal operation voltage thereof is getting larger and larger.

Consequently, it is an important subject of the circuit layout to effectively reduce the wire's resistance.

However, when the IC layout is done according to the currently used IC CAD (computer aided design) software, there are no known objective and effective rules and methods to judge whether or not the circuit layout causes the wire resistance too high. Instead, the circuit layout engineer can only check the complicated circuit layout with his/her naked eyes according to his/her experience for the subjective assertion. Thus, the prior art method is time-consuming, laborious, inefficient, and ineffective.

SUMMARY OF THE INVENTION

It is therefore an object of the invention to provide a method for checking an IC layout so as to check out the missed connection region, the region having insufficient via area, and the region of too-narrow wire width, which will cause the high wire resistance in the circuit layout. Thus, the layout engineer can modify the design according to the checking result so as to reduce the power source's voltage drop.

The invention achieves the above-identified object by providing a method for checking an IC layout. The method includes the steps of: selecting a first metal layer and a second metal layer, wherein the first metal layer is adjacent to the second metal layer, each of the metal layers has at least a wire, and the wires are coupled to each other through at least a first via; calculating the cross-sectional area of the first vias, and the area of the overlapped part of the wires; and if the ratio of the cross-sectional area to the overlapped part area is smaller than a predetermined ratio value, at least one second via is disposed in the overlapped part to couple the first and the second metal layers. Moreover, if no via is used to couple the first metal layer and the second metal layer, the area of the wire's overlapped part is calculated and at least one via is disposed in the overlapped part to couple the first metal layer and the second metal layer if the area of the overlapped part is larger than a predetermined value.

Other objects, features, and advantages of the invention will become apparent from the following detailed description of the preferred but non-limiting embodiments. The following description is made with reference to the accompanying drawings.

DETAILED DESCRIPTION OF THE INVENTION

The method for checking an IC layout according to the embodiments of the invention will be described with reference to the accompanying drawings. The layout checking method of the invention includes steps of checking an overlapped region of power layers, checking the ratio of the via area to the area of the overlapped region, and checking the wire line width. The invention performs the checks according to a graphic design system file (GDS file) and a rule file and outputs a file that may be understood by the user.

Figure 2A:
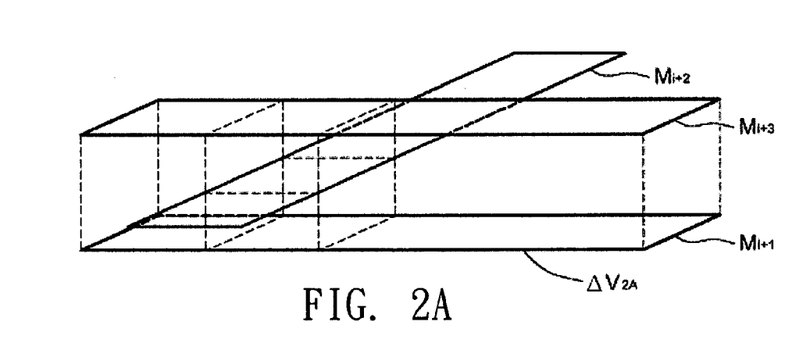
FIG. 2A shows a layout having three metal layers.
Figure 2B:
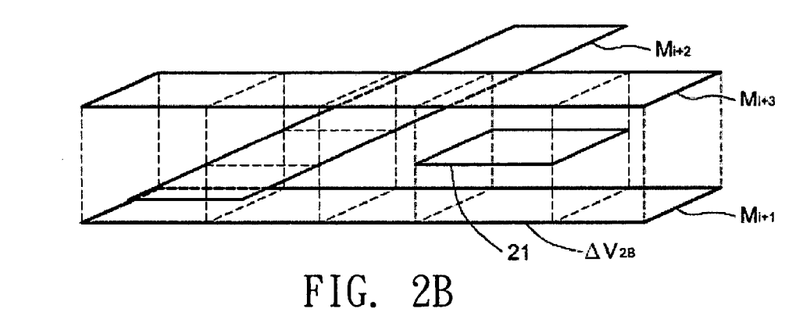
FIG. 2B shows another layout, which has lower equivalent resistance of the wire compared to that of the layout shown in FIG. 2A.

FIG. 2A shows a layout having three metal layers comprising an upper metal layer $M_{i+3}$, a lower metal layer $M_{i+1}$, and a wire region of the middle metal layer $M_{i+2}$. Of course, an insulation layer is interposed between two adjacent layers. $\Delta V_{2A}$ is the voltage difference from a point in the metal layer $M_{i+3}$ or $M_{i+1}$ to the positive or negative terminal of the voltage source. FIG. 2B shows another layout having three metal layers comprising an upper metal layer $M_{i+3}$, a lower metal layer $M_{i+1}$, and a wire region of the middle metal layer $M_{i+2}$. Of course, an insulation layer is interposed between two adjacent layers. $\Delta V_{2B}$ is the voltage difference from a point in the layer $M_{i+3}$ or $M_{i+1}$ to the positive or negative terminal of the voltage source. The layout of FIG. 2B is almost the same as that of FIG. 2A except for the metal layer 21 added to the middle layer $M_{i+2}$ exclusive of the wire region of FIG. 2B. Thus, if the upper and lower metal layers are conducted by vias through the metal layer 21, $\Delta V_{2B}$ is smaller than $\Delta V_{2A}$ because the metal layer 21 helps to conduct the two layers to reduce the wire's equivalent resistance. In other words, as long as positions in the middle layer with no wire are checked, one or more additional conductive metal layers 21 may be added to these positions and help to conduct the upper and lower metal layers $M_{i+3}$ and $M_{i+1}$ through vias, so that the power source's voltage drop caused by the wire's equivalent resistance can be effectively reduced.

Figure 3A:
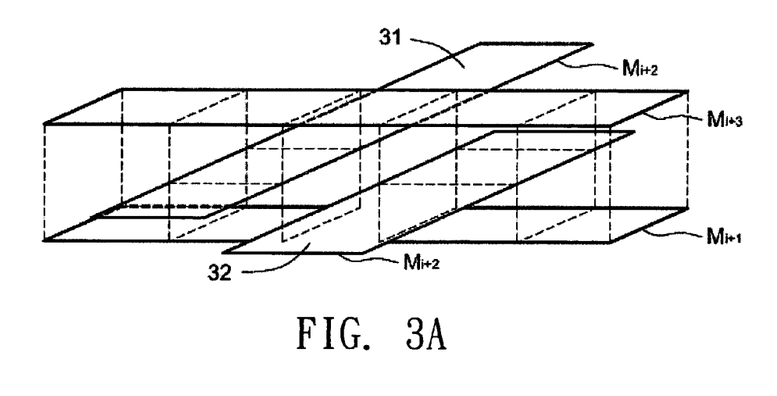
FIG. 3A shows a layout that is well designed and includes the power supply layers $M_{i+3}$ and $M_{i+1}$, and a signal layer $M_{i+2}$.

The method for checking the overlapped region of the power layers according to an embodiment of the invention will be described in FIG. 3. FIG. 3A shows a circuit layout that is well designed and includes the power supply layers of an upper metal layer $M_{i+3}$ and a lower metal layer $M_{i+1}$, and a wire regions 31 and 32 of a middle layer $M_{i+2}$. Of course, an insulation layer is interposed between two adjacent layers. As shown in FIG. 3A, the signal layer $M_{i+2}$ has two wire regions 31 and 32. The method of the invention for checking the overlapped region of the power layers is to search the overlapped region of the upper and lower layers $M_{i+3}$ and $M_{i+1}$ without the wire regions 31 and 32 disposed between the upper and lower layers $M_{i+3}$ and $M_{i+1}$. That is, $$(M_{i+1} \cap M_{i+3}!(31 \text{ and } 32 \text{ of } M_{i+2})) \qquad (3).$$

Figure 3B:
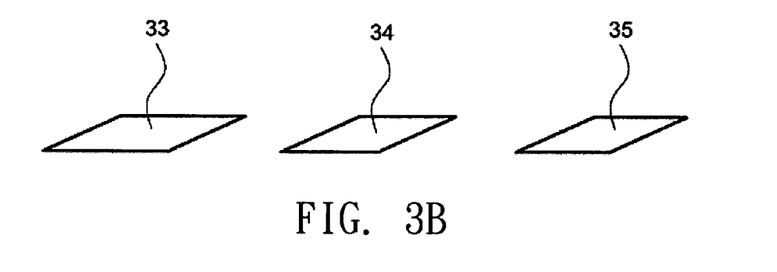
FIG. 3B shows the output region after the process of checking the overlapped region of the power layers in the layout of FIG. 3A.

It is possible to search the total overlapped region of the upper metal layer $M_{i+3}$ and the lower metal layer $M_{i+1}$, and then filter out the wire regions 31 or 32 of the middle layer $M_{i+2}$. FIG. 3B shows the regions 33, 34 and 35, which are outputted after checking the layout shown in FIG. 3A. Of course, the wires to be checked in the upper metal layer $M_{i+3}$ and the lower metal layer $M_{i+1}$ are power lines. Since it's not necessary to output the overlapped region with small area, the CAD software may set an adjustable threshold area and output the region having an area larger than the threshold area after comparing the area of each overlapped region to the area threshold value. The layout engineer may refer to the region marked by the CAD software to modify the original circuit layout, such as adding a conductive metal layer in the region marked by the CAD software in the middle layer $M_{i+2}$, and providing vias between the metal layer and the upper metal layer $M_{i+3}$ and between the metal layer and the lower metal layer $M_{i+1}$. Thus, the wire's equivalent resistance causing the power source's voltage drop can be reduced.

Figure 4A:
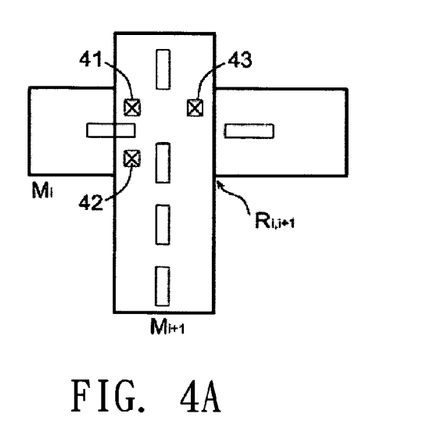
FIG. 4A shows the layout of the upper and lower metal layers $M_i$ and $M_{i+1}$, which are conducted by vias.
Figure 4B:
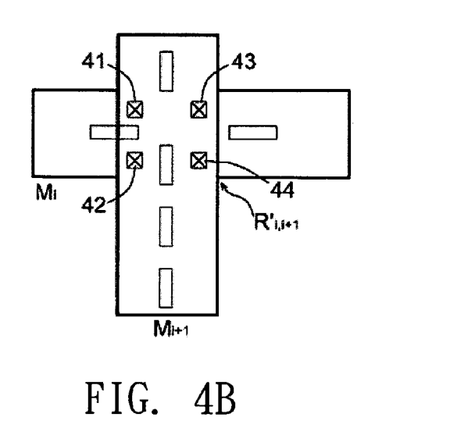
FIG. 4B shows the layout with one more via compared to that of FIG. 4A.

FIG. 4A shows the layout, wherein the upper and lower metal layers $M_i$ and $M_{i+1}$ are overlapped and conducted by vias. As shown in this drawing, the metal layer $M_i$ is conducted to the metal layer $M_{i+1}$ by the vias 41, 42 and 43, and the equivalent wire resistance between the metal layers $M_i$ and $M_{i+1}$ is defined as $R_{i,i+1}$. FIG. 4B shows the layout similar to FIG. 4A, wherein the upper and lower metal layers $M_i$ and $M_{i+1}$ are overlapped and conducted using vias. As shown in this drawing, the metal layer $M_i$ is conducted to the metal layer $M_{i+1}$ by the vias 41, 42, 43 and 44, and the equivalent wire resistance between the metal layers $M_i$ and $M_{i+1}$ are defined as $R'_{i,i+1}$. Because the circuit layout in FIG. 4B has one more via compared to the layout shown in FIG. 4A, the equivalent resistance $R'_{i,i+1}$ is smaller than the equivalent resistance $R_{i,i+1}$ according to the above-mentioned description. So, the method for checking the area ratio of via area in the invention is used for checking a region with a smaller area ratio of via area, so as to reduce the equivalent resistance by adding vias in this region and thus to reduce the voltage drop.

Figure 5A:
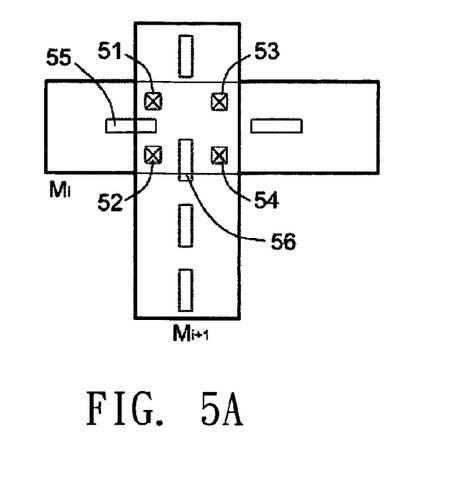
FIG. 5A shows the overlapped layout of the upper and lower metal layers $M_i$ and $M_{i+1}$, which are conducted by vias.
Figure 5B:
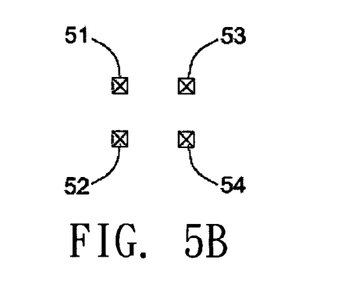
FIG. 5B shows the region of the vias in the layout of FIG. 5A.
Figure 5C:
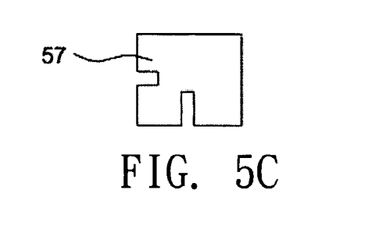
FIG. 5C shows the overlapped region of the metal layers in the layout of FIG. 5A.

The method for checking the ratio of via area according to an embodiment of the invention will be described with reference to FIG. 5. FIG. 5A shows the layout, wherein the upper and lower metal layers $M_i$ and $M_{i+1}$ are overlapped and conducted by vias 51, 52, 53 and 54. The method for checking the ratio of the via area is to search the overlapped region of the metal layers $M_i$ and $M_{i+1}$ such as the overlapped region 57 shown in FIG. 5C, wherein the overlapped region 57 excludes the region overlapping the metal slots 55 and 56 and the area of the overlapped region 57 is calculated as $A_{over}$. Next, the vias in the overlapped region 57 are found as shown in FIG. 5B, and the area of the vias 51, 52, 53 and 54 are calculated as $A_{via}$. Then, the area ratio $R_A$ is calculated by:

$$R_A = A_{via}/A_{over} \qquad (4).$$

Since the region having large area ratio $R_A$ is not necessary to be output, a threshold value is set in advance and the CAD software can mark and output the overlapped region having an area ratio $R_A$ smaller than the threshold value. So, the layout engineer may increase the number of the vias in the output region, so as to reduce the equivalent wire resistance and thus reduce the voltage drop induced by the equivalent wire resistance.

Figure 6A:
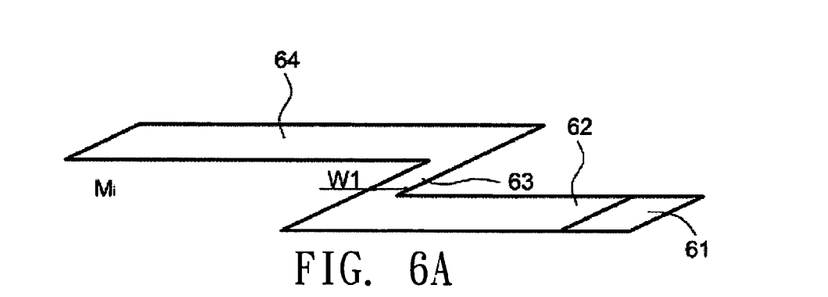
FIG. 6A shows the layout of one metal layer.
Figure 6B:
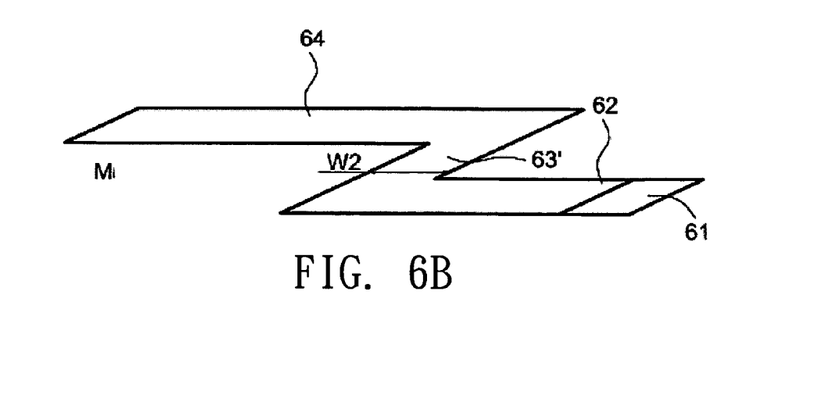
FIG. 6B shows another layout of one metal layer with a wider wire compared to that of FIG. 6A.

FIG. 6A shows the layout of one metal layer. As shown in this drawing, the metal layer $M_i$ includes a contact pad 61 and wires 62, 63 and 64. FIG. 6B shows another layout of one metal layer. Referring to FIG. 6B, the metal layer $M_i$ includes a contact pad 61 and wires 62, 63' and 64. The layout of FIG. 6A is almost the same as that of FIG. 6B except for the difference that the wire 63' of FIG. 6B is wider than the wire 63 of FIG. 6A. According to the resistor's law, the smaller the cross-sectional area, the larger the resistance. So, the equivalent resistance of the wire 63 in FIG. 6A is larger than that of the wire 63' in FIG. 6B. If the contact pad 61 is a power connection pad, the electric current flowing through the wire 63 will be relatively large because the wire 63 is quite close to the power connection pad 61. Consequently, the voltage drop of the overall circuit is greatly influenced (increased) by the equivalent resistance of the wire 63. Thus, the wire line width can be checked according to the present invention, so as to find out the wire with narrow line width. The layout engineer may correct the designed circuit layout diagram according to the checked result.

Figure 7A:
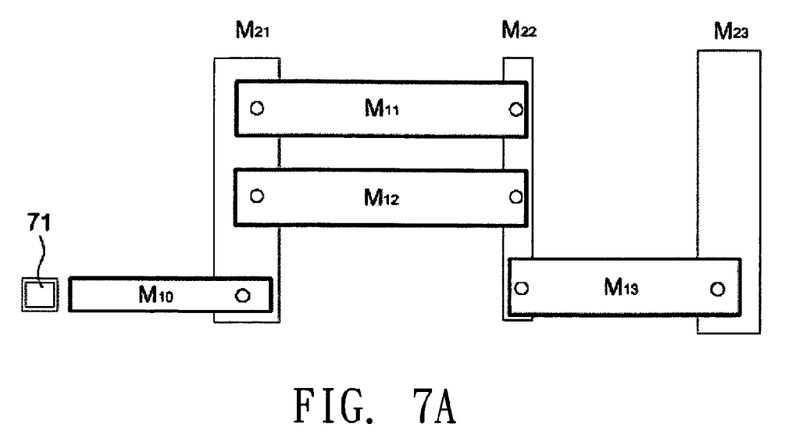
FIG. 7A shows the layout to be checked.
Figure 7B:
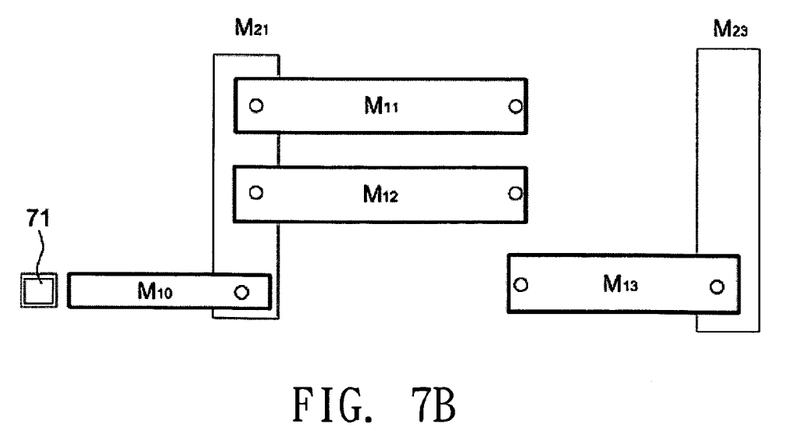
FIG. 7B shows the layout after checking the wire line width.

FIG. 7A shows the layout to be checked and FIG. 7B shows the layout after checking the wire line width. Referring to FIG. 7A, the layout includes a first layer of wires $M_{10}$, $M_{11}$, $M_{12}$ and $M_{13}$, and a second layer of wires $M_{21}$, $M_{22}$ and $M_{23}$, wherein the wire $M_{10}$ has a voltage source connection pad 71 coupled to the voltage source, and the wire $M_{22}$ is narrow. Referring to FIG. 7B, the layout includes a first layer of wires $M_{10}$, $M_{11}$, $M_{12}$ and $M_{13}$, and a second layer of wires $M_{21}$ and $M_{23}$. Obviously, the FIG. 7B lacks the wire $M_{22}$ compared to FIG. 7A.

The method for checking the wire line width in the embodiment of the invention comprises: reading the circuit layout diagram of the power metal layer as shown in FIG. 7A, narrowing the wire line widths of all wires shown in the FIG. 7A according to a line width threshold value determined by the user, and regaining the original wire line width of the wire whose line width isn't narrowed to zero previously. Consequently, the wire (e.g., $M_{21}$) having a line width larger than the line width threshold value recovers to have its original line width, and the wire (e.g., $M_{22}$) having a line width smaller than the line width threshold value is eliminated as shown in FIG. 7B.

Finally, a corresponding metal wire network diagram is created according to the checked circuit layout diagram as shown in FIG. 7B, and each independent network in the drawing is further checked. If there is an independent network that does not contain the voltage source, the independent network is outputted as a problem network.

Figure 8A:
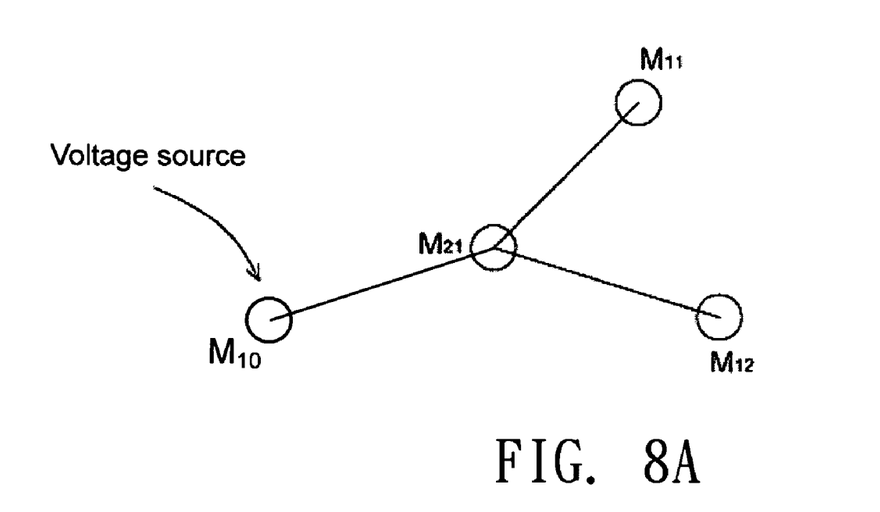
FIGS. 8A and 8B are network diagrams of the metal wires illustrated according to FIG. 7B.
Figure 8B:
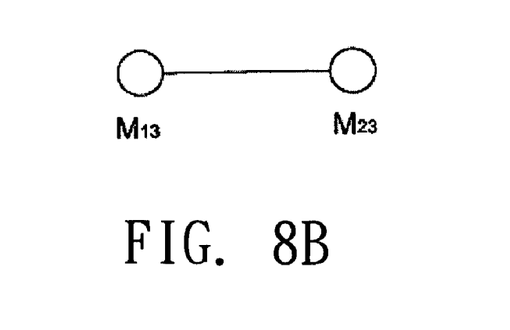

FIGS. 8A and 8B are network diagrams of the metal wires in accordance with FIG. 7B. In FIGS. 8A and 8B, each node corresponds to one metal wire of FIG. 7B, and two nodes are connected by a line segment if the nodes are coupled through a via. Hence, the circuit layout diagram of FIG. 7B may be illustrated as two independent networks of FIGS. 8A and 8B. The independent network of FIG. 8A includes the wire $M_{10}$ having the voltage source connection pad. Therefore, it means that the line width of the metal wire is all right in this independent network. In the independent network of FIG. 8B, however, no wire has a voltage source connection pad coupled to the voltage source. Thus, it means that the line width of the metal wire coupled to the metal wire having the voltage source connection pad is too narrow. So, the corresponding metal wires in FIG. 8B is marked and outputted, and the layout engineer may correct the layout according to the output information.

Figure 9:
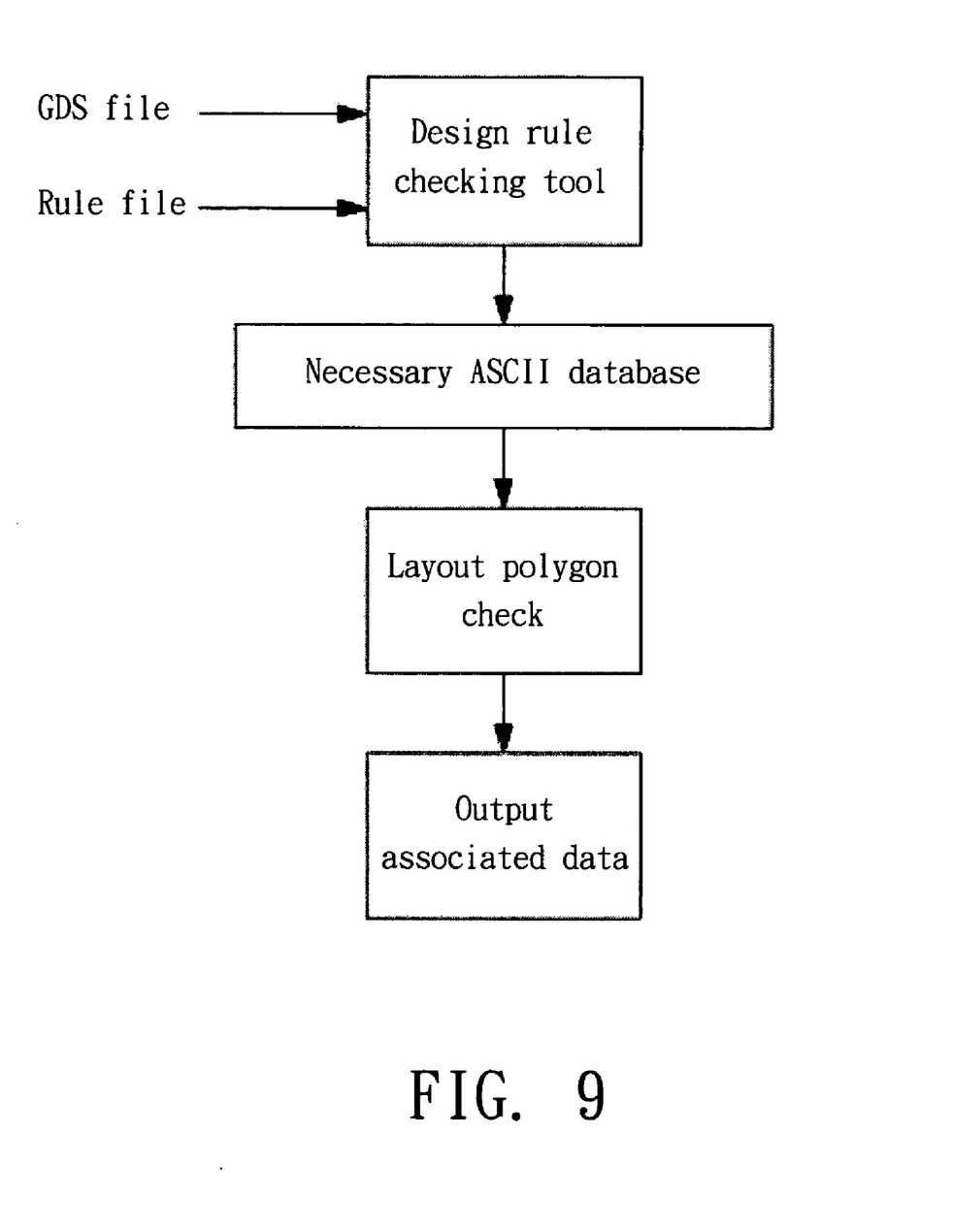
FIG. 9 shows the steps of the method for checking the IC layout according to an embodiment of the invention.

FIG. 9 shows the steps of the method for checking the circuit layout in the invention. First, a DRC (Design Rule Check) tool is used to dump the GDS file and the rule file. The DRC tool generates the necessary ASCII database. In the layout polygon check, the desired items, such as the power layers overlapped region checking, the via area ratio checking and the wire line width checking, may be checked according to the necessary ASCII database and the threshold value inputted by the user. Consequently, the associated data are then output.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for reducing an equivalent resistance in an IC layout, the IC layout comprising a plurality of metal layers, the method comprising:
   checking the IC layout, comprising:
      determining a first metal layer among the metal layers, the first metal layer comprising at least a wire;
      determining a second metal layer among the metal layers, the second metal layer comprising at least a wire, at least a part of the wire of the second metal layer overlapping at least a part of the wire of the first metal layer and thereby an overlapped region being determined, the wire of the first metal layer conducting to the wire of the second metal layer through at least one via disposed in the overlapped region;
      calculating a ratio of the area of the via to the area of the overlapped region; and
      determining whether the ratio is smaller than a threshold value and thereby generating a checking result; and
   modifying the IC layout according to the checking result, comprising:
      disposing one or more extra vias in the overlapped region according to the checking result, so as to assist the conduction between the wire of the first metal layer and the wire of the second metal layer and thereby reduce the equivalent resistance between the first and second metal layers in the IC layout.

2. The method of claim 1, wherein the step of disposing the extra via/vias is executed when the result indicates that the ratio is smaller than the threshold value.

3. The method of claim 2, wherein the number of the extra vias is determined in accordance with the result.

4. The method of claim 1, wherein the steps of checking and modifying the IC layout are executed by a software.

5. The method of claim 1, wherein at least one of the wires of the first metal layer and the second metal layer comprises a metal slot and the area of the metal slot is excluded from the area of the overlapped region.

* * * * *